(12) United States Patent
Eguchi et al.

(10) Patent No.: US 6,649,822 B2
(45) Date of Patent: Nov. 18, 2003

(54) STRUCTURE AND METHOD FOR MOUNTING SOLAR BATTERY MODULES

(75) Inventors: Yoshihito Eguchi, Nara (JP); Takashi Tomita, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/971,685

(22) Filed: Oct. 9, 2001

(65) Prior Publication Data

US 2002/0043031 A1 Apr. 18, 2002

(30) Foreign Application Priority Data

Oct. 13, 2000 (JP) .......................... 2000-313803

(51) Int. Cl.⁷ .......................... H01L 31/05; E04D 13/18
(52) U.S. Cl. .................. 136/251; 136/244; 136/291; 52/173.3
(58) Field of Search ................. 136/244, 256, 136/291, 251; 52/173.3; 257/459; 438/64

(56) References Cited

U.S. PATENT DOCUMENTS

| | | | | |
|---|---|---|---|---|
| 4,133,697 A | * | 1/1979 | Frosch et al. ............... 136/245 |
| 5,185,042 A | * | 2/1993 | Ferguson ..................... 136/244 |
| 5,482,569 A | * | 1/1996 | Ihara et al. .................. 136/251 |
| 6,201,180 B1 | * | 3/2001 | Meyer et al. ................ 136/244 |
| 6,224,016 B1 | * | 5/2001 | Lee et al. ...................... 244/30 |
| 6,360,497 B1 | * | 3/2002 | Nakazima et al. ......... 52/173.3 |

FOREIGN PATENT DOCUMENTS

JP          11-22127          1/1999

* cited by examiner

Primary Examiner—Nam Nguyen
Assistant Examiner—Brian L Mutschler
(74) Attorney, Agent, or Firm—Nixon & Vanderhye P.C.

(57) ABSTRACT

According to a method for mounting a plurality of solar battery modules, an underlying member (roofing member) is fixed at a location where the solar battery modules are to be mounted. The underlying member has a wiring made of conductive material that is formed for drawing electric power from the solar battery modules and has connection terminals at respective positions to be connected with each solar battery module. Connection terminals of each solar battery module are coupled with the connection terminals of the underlying member to fasten each solar battery module.

12 Claims, 6 Drawing Sheets

STRUCTURE AND METHOD FOR MOUNTING SOLAR BATTERY MODULES

BACKGROUND OF THE INVENTION

1. Field of the Invention

The present invention relates to a structure and a method for mounting a plurality of solar battery modules on a roof of a building or the like.

2. Description of the Background Art

In recent years, various types of solar electric power generation systems for housing have been developed. The solar electric power generation system applied to housing includes a plurality of solar battery modules each composed of a plurality of solar cells. The system is constructed for example by arranging the solar battery modules on a roof of a building or the like and connecting the modules in series or parallel.

Figure 10:
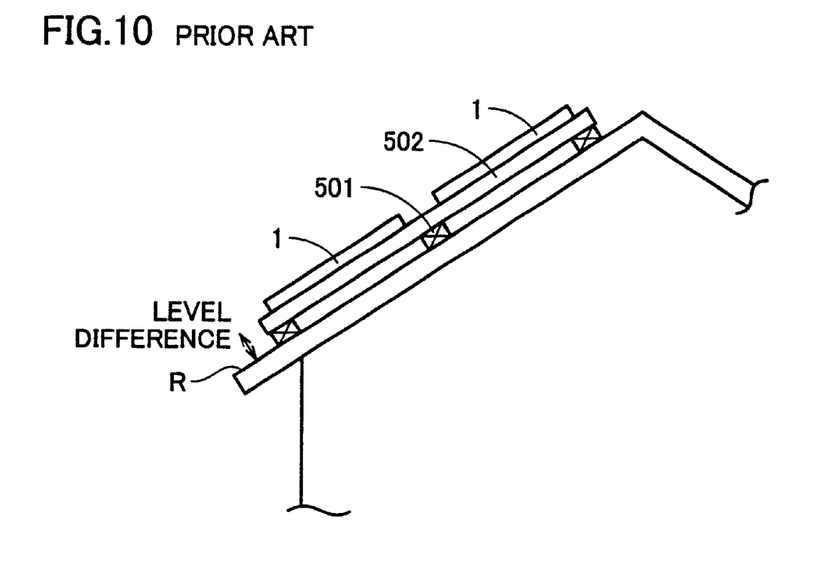
FIG. 10 shows a conventional structure for mounting solar battery modules.

The solar electric power generation system for housing has conventionally been structured as shown in FIG. 10 by providing horizontal and vertical bases 501 and 502 on a roof R and then mounting a plurality of solar battery modules 1 thereon.

The solar battery modules are connected directly by means of cables or cords. However, such a connection by means of cables or the like complicates wiring and thus the wiring operation requires a considerable time.

Figure 11:
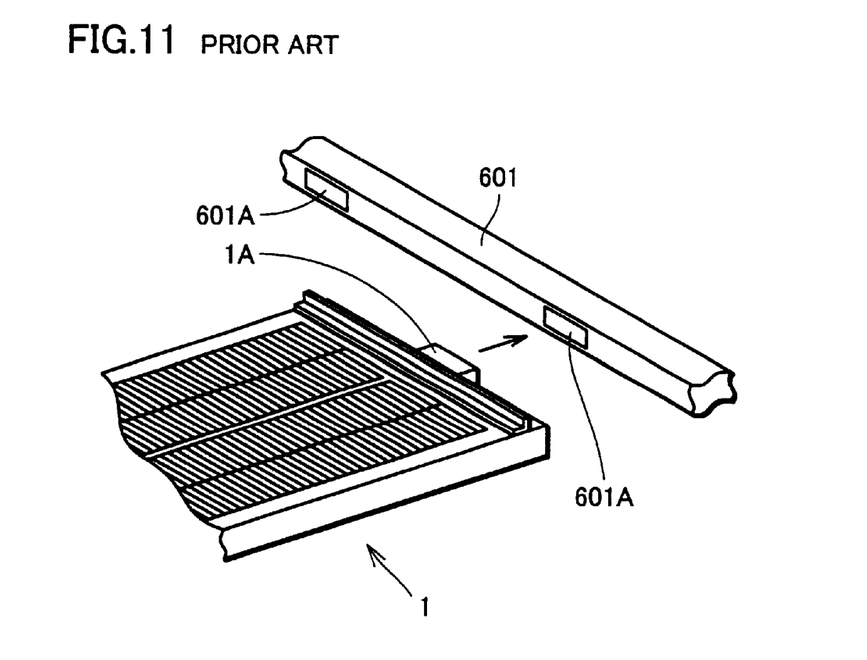
FIG. 11 shows a conventional method of connecting solar battery modules.

A method has accordingly be proposed as shown in FIG. 11 that uses a wiring member 601 containing power-collecting lines for drawing electric power from solar battery modules 1 and having a plurality of recessed connection terminals 601A. Wiring member 601 is placed around or at the center of a roof. Then, solar battery modules 1 are mounted on the roof and a protruded connection terminal 1A of each solar battery module 1 and recessed connection terminal 601A of wiring member 601 are connected to each other (see Japanese Patent Laying-Open No. 11-22127 as one example).

The module-mounting structure shown in FIG. 10 requires a complicated operation for assembling horizontal and vertical bases 501 and 502 so that a considerable time is necessary to mount the solar battery modules. Moreover, there is a level difference, between solar battery modules 1 and the roof surface, corresponding to the height of horizontal and vertical bases 501 and 502, resulting in a problem in terms of appearance.

The connection method shown in FIG. 11 requires several wiring members 601 for connecting solar battery modules 1, resulting in a problem that the operation therefor is complex and takes a considerable time.

SUMMARY OF THE INVENTION

The present invention is made to solve the problems above. One object of the present invention is to provide a structure and a method for mounting solar battery modules to simplify the operation for mounting the solar battery modules and connecting them to each other and shorten the time therefor.

According to the present invention, a mounting structure for mounting a plurality of solar battery modules includes an underlying member (roofing member) fixed at a location (roof of a building or the like) where the solar battery modules are to be mounted. The underlying member includes a wiring made of conductive material formed for drawing electric power from the solar battery modules and includes connection terminals at respective positions to be connected with each solar battery module. Each solar battery module is connected to the connection terminals of the underlying member.

The mounting structure according to the present invention thus has the underlying member provided with the wiring for drawing electric power from the solar battery modules and with the connection terminals for connection with the solar battery modules. Wiring is thus completed merely by coupling connection terminals of each solar battery module with the connection terminals of the underlying member placed on a roof for example. The wiring operation is then simplified and the time for wiring can be shortened. Additionally, any connection error can be avoided in wiring of solar battery modules to each other.

The mounting structure fixes the underlying member at the location where the solar battery modules are to be mounted and then the solar battery modules are mounted. It is unnecessary to assemble base members on a roof or the like so that the mounting operation is less complicated. Moreover, there is only the underlying member of a small thickness (e.g. approximately 1 mm) between the solar battery modules and the mounting surface (surface of the roof) so that the solar battery modules can be mounted with almost no level difference therebetween.

The mounting structure according to the present invention may use a plurality of underlying members for mounting the solar battery modules. When a plurality of underlying members are used, one underlying member can have its weight and size reduced accordingly. Consequently, the underlying members can be carried easily and the efficiency in mounting operation is improved. The underlying members can be wired by means of cable, metal line, metal foil, or the like. The underlying members may partially be overlapped to be wired to each other.

The mounting structure according to the present invention may have marks attached to the underlying member for indicating a position where the solar battery modules are to be mounted. Then, the solar battery modules can accurately be positioned. By the mounting structure of the present invention, the position where the solar battery modules are to be mounted can roughly be specified based on the positions of connection terminals used for connection with solar battery modules. The marks indicating the mounting position make it possible to more accurately position the solar battery modules.

The attachment of marks facilitates confirmation of the mounting position so that the time for mounting can be shortened. The shape of marks indicating the mounting position of the solar battery modules is not particularly limited and may be character, symbol, line, picture or the like on the condition that the mounting position can be known from the marks.

The mounting structure according to the present invention may have holes formed in the underlying member at respective positions where the solar battery modules are to be mounted. The holes formed in the underlying member can be used for directly fixing, by adhesive, the solar battery modules to a roof or the like. Then, the solar battery modules can firmly be fastened. Moreover, the holes of the underlying member can be used as marks indicating the position where the solar battery modules are to be mounted. Then, the mounting position of the solar battery modules can easily be acquired.

A mounting method for mounting a plurality of solar battery modules according to the present invention includes fixing of an underlying member at a location (roof of a building or the like) where the solar battery modules are to be mounted. The underlying member includes a wiring made of conductive material formed for drawing electric power from the solar battery modules and includes connection terminals at respective positions to be connected with each solar battery module. The method further includes connecting of each solar battery module to the connection terminals of the underlying member and subsequent fastening of each solar battery module.

According to the mounting method of the present invention, the underlying member is provided with the wiring for drawing electric power from the solar battery modules and the connection terminals for connection with the solar battery modules. Wiring is thus completed merely by coupling connection terminals of each solar battery module with the connection terminals of the underlying member placed on a roof for example. The wiring operation is then simplified and the time for wiring can be shortened. Additionally, any connection error can be avoided in wiring of solar battery modules to each other.

The underlying member is fixed at the location where the solar battery modules are to be mounted and then the solar battery modules are mounted. It is unnecessary to assemble base members on a roof or the like so that the mounting operation is less complicated. Moreover, there is only the underlying member of a small thickness (e.g. approximately 1 mm) between the solar battery modules and the mounting surface (surface of the roof) so that the solar battery modules can be mounted with almost no level difference therebetween.

According to the mounting method of the present invention, a plurality of underlying members may be used for mounting the solar battery modules. When a plurality of underlying members are used, one underlying member can have its weight and size reduced accordingly. Consequently, the underlying members can be carried easily and the efficiency in mounting operation is improved. The underlying members can be wired by means of cable, metal line, metal foil or the like. The underlying members may partially be overlapped to be wired to each other.

According to the mounting method of the present invention, marks may be attached to the underlying member for indicating the position where the solar battery modules are to be mounted and the marks are used for mounting the modules. Then, the solar battery modules can accurately be positioned. Moreover, the attachment of marks allows the mounting position to readily be confirmed so that the time for mounting operation can be shortened. The shape of marks indicating the position is not particularly limited and may be character, symbol, line, picture or the like on the condition that the mounting position can be known from the marks.

According to the mounting method of the present invention, holes may be formed in the underlying member at respective positions where the solar battery modules are to be mounted and the holes may be used for mounting the modules. The holes formed in the underlying member can be used for directly fixing, by adhesive, the solar battery modules to a roof or the like. Then, the solar battery modules can firmly be fastened. Moreover, the holes of the underlying member can be used as marks indicating the position where the solar battery modules are to be mounted. Then, the mounting position of the solar battery modules can easily be acquired.

The underlying member used according to the present invention may be any member which can be folded or a sheet-like member made of hard material.

The wiring formed in the underlying member may be made of any conductive material and there is no particular limitation concerning the material. Specifically, the wiring may be made of cable, metal line, metal foil or the like.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described in conjunction with the drawings.

First Embodiment

Figure 1:
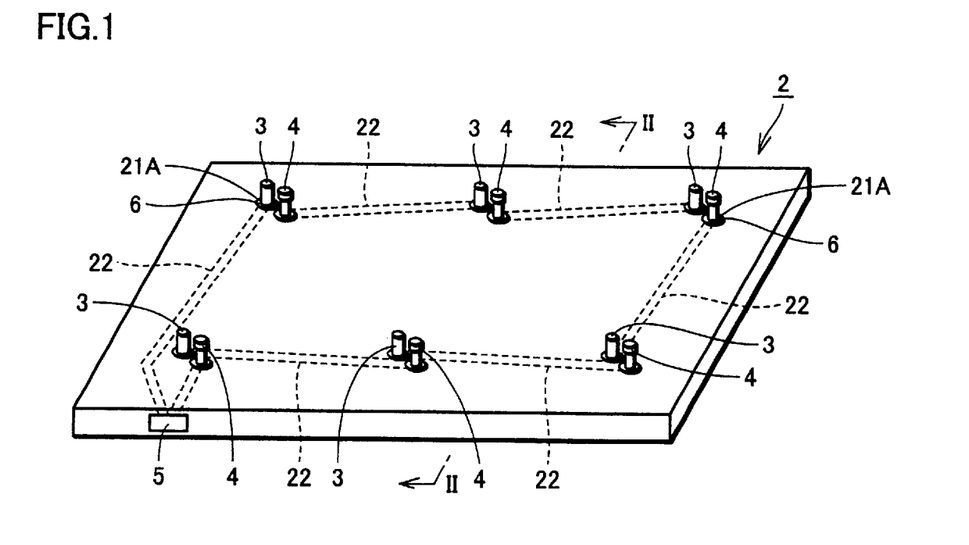
FIG. 1 is a perspective view showing an example of a roofing member used for an embodiment of the present invention.
Figure 2:
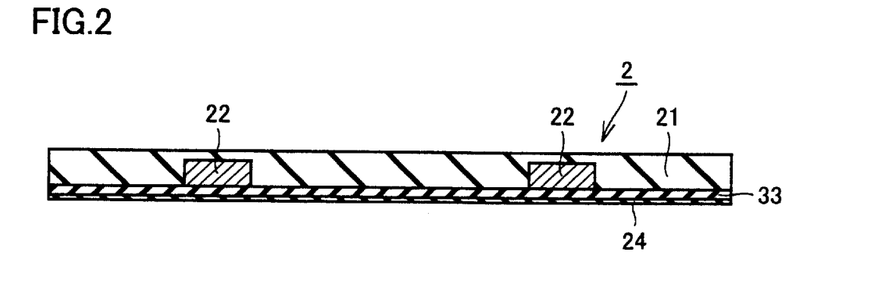
FIG. 2 is a cross sectional view along line II—II in FIG. 1.

FIG. 1 is a perspective view showing a structure of a roofing member 2 used for a first embodiment. FIG. 2 is a cross sectional view along line II—II in FIG. 1.

Roofing member 2 is used for mounting and connecting a plurality of solar battery modules 1 and has a three-layered structure consisting of a board 21 made of rubber (EPDM (ethylene-propylene-diene terpolymer)), a reinforcing layer 33 and an adhesive layer 24. Roofing member 2 is approximately 1 mm in thickness.

Roofing member 2 has a wiring pattern 22 for drawing electric power from solar battery modules 1. In addition, a connector 5 is provided on an end surface for supplying the collected power to the outside.

Roofing member 2 is provided with a plus (+) connection terminal 3 and a minus (−) connection terminal 4 for connection with solar battery modules 1. (+) connection terminal 3 and (−) connection terminal 4 are structured to be coupled with connection terminals (not shown) of solar battery modules 1 and rendered waterproof in the coupled state. (+) and (−) connection terminals 3 and 4 are arranged at respective positions where corresponding connection terminals of each of the mounted solar battery modules 1 are placed.

Wiring pattern 22 is formed by patterning a copper foil into the shape as shown in FIG. 1 on the bottom surface of board 21. For this embodiment, solar battery modules 1 are wired in series. (+) connection terminal 3 and (−) connection terminal 4 are provided by making holes 21A in board 21 to partially expose wiring pattern 22, placing (+) connection terminal 3 or (−) connection terminal 4 in each of holes 21A, and then connecting the terminal with wiring pattern 22 by soldering or any like method. Gaps between inner surfaces of holes 21A in board 21 and connection terminals 3 and 4 are filled with silicone resin 6 for enhancement of insulating and waterproofing performances.

The material filling the gaps between the inner surfaces of holes 21A and connection terminals 3 and 4 is not limited to the silicone resin and any arbitrary material such as adhesive and rubber which can fill the gaps may be used.

Figure 3:
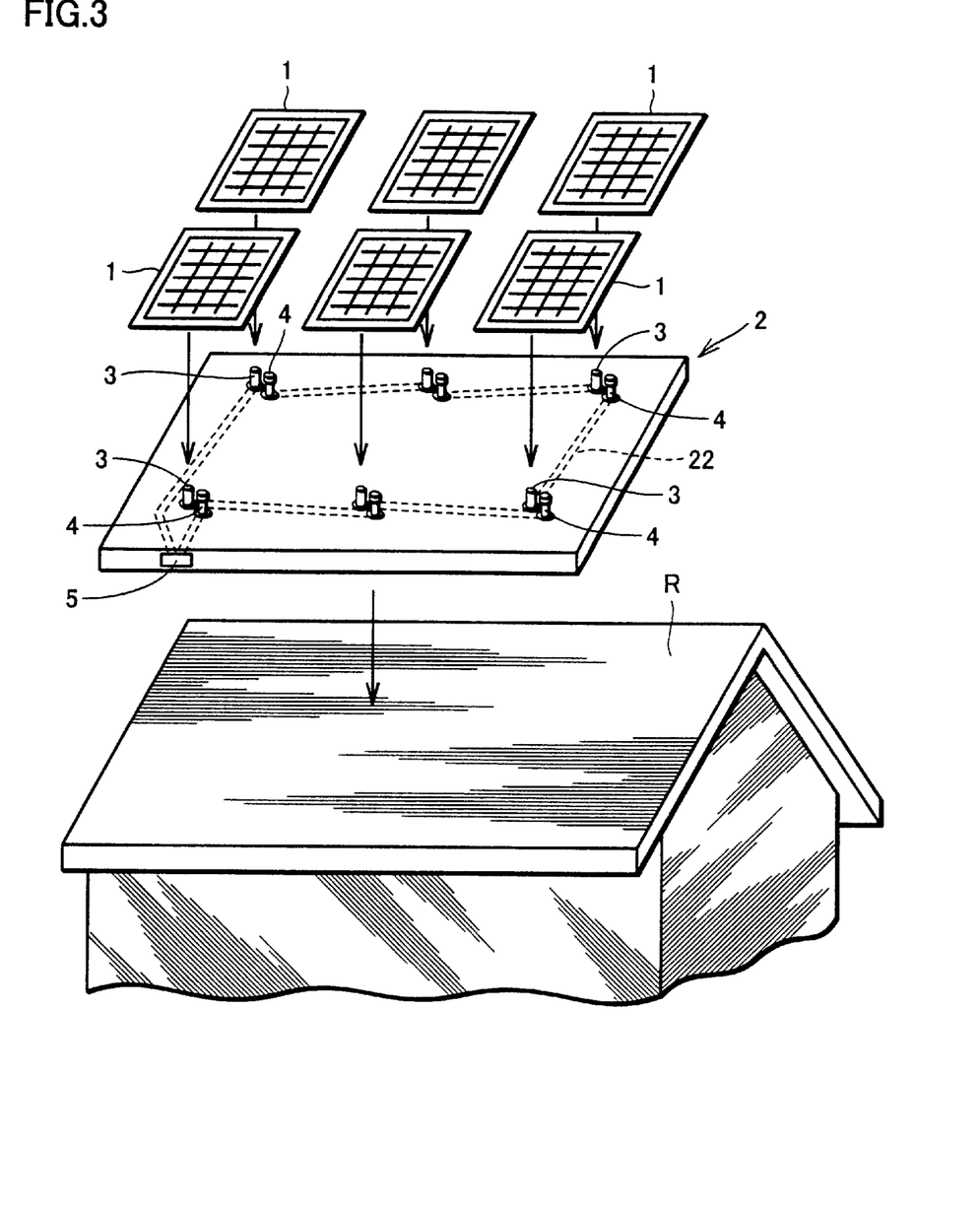
FIG. 3 illustrates a method of mounting by means of the roofing member shown in FIG. 1.
Figure 4:
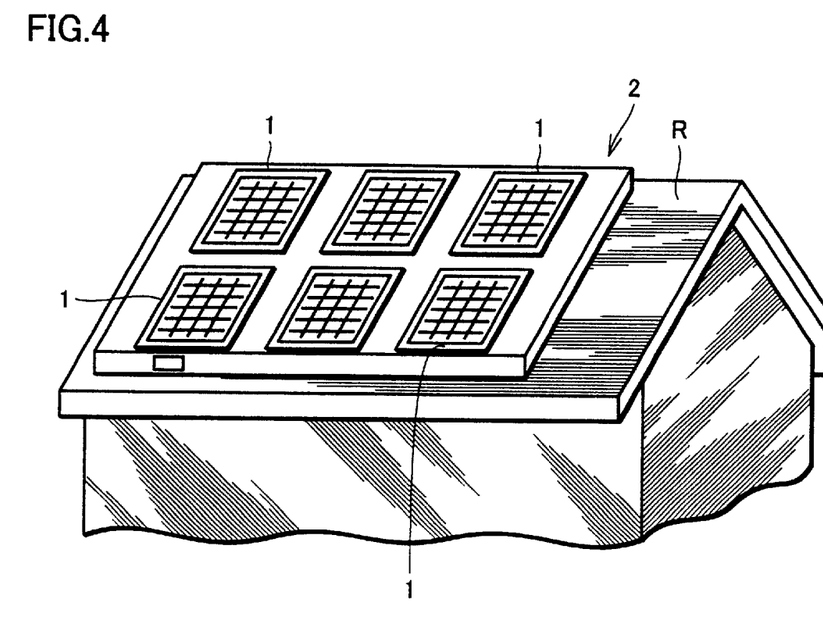
FIG. 4 is a perspective view of a mounting structure using the roofing member in FIG. 1.

When roofing member 2 shown in FIG. 1 is used for mounting solar battery modules, roofing member 2 is first bonded to a roof R as shown in FIG. 3. Then, a plurality of solar battery modules 1 are arranged on roofing member 2 to couple connection terminals (not shown) of each solar battery module 1 with corresponding (+) connection terminal 3 and (−) connection terminal 4. After this, solar battery modules 1 are each fixed by using screws. FIG. 4 shows an external view of roof R on which the modules are mounted in this way.

According to the first embodiment, use of roofing member 2 for mounting solar battery modules 1 facilitates the operation for mounting the modules. Moreover, solar battery modules 1 can be mounted with almost no level difference since only roofing member 2 of approximately 1 mm in thickness is present between solar battery modules 1 and the roof surface.

In addition, the wiring operation is also facilitated because wiring pattern 22 for drawing electric power from the solar battery modules as well as connection terminals 3 and 4 for connection with the solar battery modules are provided to roofing member 2 so that the wiring operation is completed merely by coupling the connection terminals of each solar battery module 1 with connection terminals 3 and 4 of roofing member 2 placed on roof R. Consequently, the operation time can be shortened.

Although roofing member 2 is rectangular in shape according to the first embodiment, the present invention is not limited to such a shape and thus roofing member 2 may be square or circular according to any shape of the wiring pattern. In addition, instead of wiring pattern 22 of copper foil formed in roofing member 2, another conductive material such as metal line and cable can be used to implement the present invention. Further, instead of wiring solar battery modules in series, the modules may be wired in parallel.

According to the first embodiment discussed above, one roofing member 2 is used. However, a plurality of roofing members 2 may be arranged on roof R to mount solar battery modules 1 thereon.

According to the first embodiment above, roofing member 2 is bonded to roof R. However, screws may be used to fix roofing member 2 on the roof. Further, solar battery modules 1 may be fixed by means of adhesive instead of screws.

Second Embodiment

Figure 5:
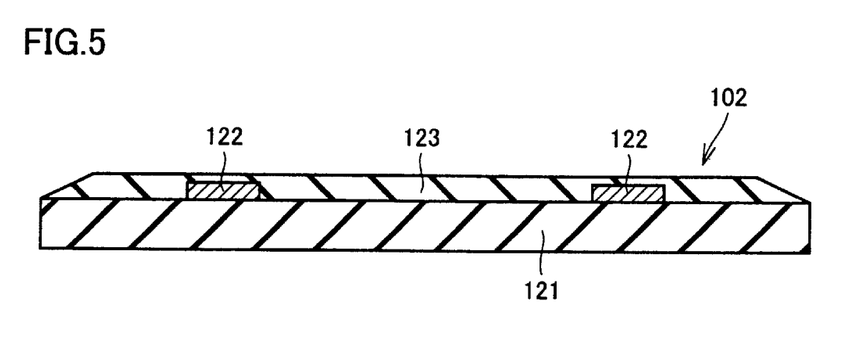
FIG. 5 is a vertical cross sectional view showing another example of the roofing member.

FIG. 5 is a vertical cross sectional view showing another example of the roofing member.

A roofing member 102 shown in FIG. 5 has a characteristic that a wiring pattern 122 of aluminum foil is formed on a surface of a plastic board 121 and wiring pattern 122 and board 121 are covered with a resin film 123. This structure can be used for wiring regardless of the material of the roofing member (board).

Third Embodiment

Figure 6:
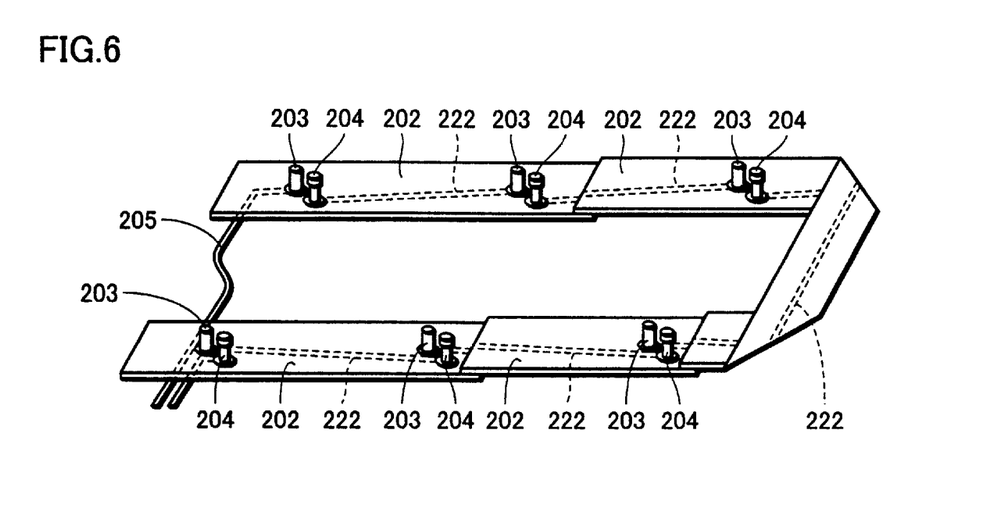
FIG. 6 is a perspective view of an embodiment constituted by using a plurality of roofing members.

FIG. 6 is a perspective view of an embodiment constituted by using a plurality of roofing members.

This embodiment is characterized by four roofing members 202 used for mounting solar battery modules.

One roofing member 202 has a width of 10 cm. Each roofing member 202 is provided with a wiring pattern (copper foil) 222 for drawing electric power from solar battery modules 1 and (+) connection terminals 203 and (−) connection terminals 204 for connection with solar battery modules as the roofing member shown in FIG. 1.

Wiring patterns 222 of four roofing members 202 are connected to each other by making a hole in an end of each roofing member 202 to expose an end of wiring pattern 222 and connecting respective ends of wiring patterns 222 by soldering. Two methods are employed here for wiring between ends of two roofing members arranged on the upper side and ends of two roofing members arranged on the lower side. Specifically, connection by a cable 205 and connection by folding roofing member 202 as shown in FIG. 6 are used for connecting wiring patterns of the roofing members.

Figure 7:
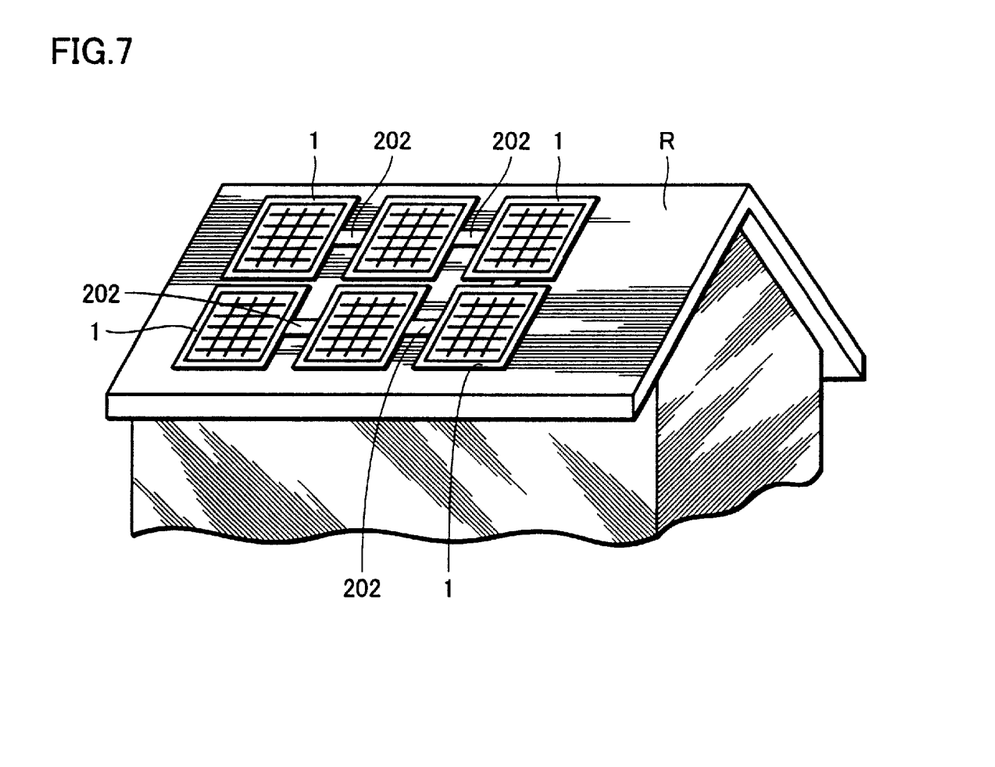
FIG. 7 is a perspective view of a mounting structure by means of the roofing member in FIG. 6.

These roofing members 202 are used for mounting solar battery modules 1 through a procedure as that of the first embodiment described above. Specifically, solar battery modules 1 can be mounted by bonding four roofing members 202 to a roof R, arranging a plurality of solar battery modules 1 on roofing members 202, coupling connection terminals (not shown) of each solar battery module 1 with corresponding (+) connection terminals 203 and (−) connection terminals 204, and then fixing each solar battery module 1 by means of screws. FIG. 7 shows an external view of roof R on which the modules are thus mounted.

According to the third embodiment, a plurality of roofing members 202 each having a narrow width are used. Roofing members 202 are thus convenient in terms of portability and efficiency in mounting of the modules is improved.

The width of roofing member 202 is not limited to 10 cm which is employed for this embodiment and roofing member 202 may have any arbitrary width.

In addition, ends of roofing members 202 may be wired by any method, instead of the one shown in FIG. 6, by using cables for connecting both ends of the upper two roofing members and both ends of the lower two roofing members or by folding roofing members to connect them.

Fourth Embodiment

Figure 8:
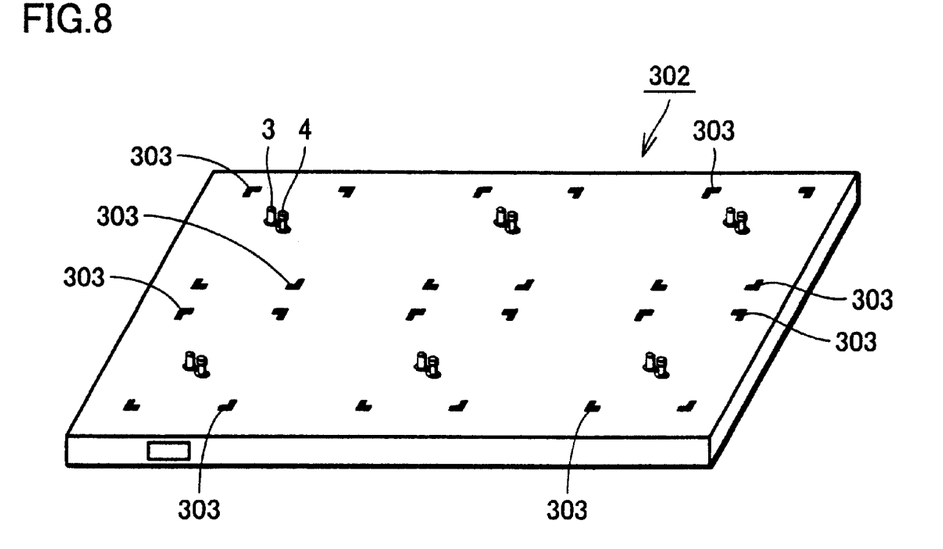
FIG. 8 is a perspective view showing a further example of the roofing member.

FIG. 8 is a perspective view showing a further example of the roofing member.

A roofing member 302 shown in FIG. 8 has a characteristic that roofing member 302 has, on the upper surface thereof, hook-shaped marks 303 indicating the position where solar battery modules 1 are to be mounted, in addition to the structure of roofing member 2 shown in FIG. 1.

Marks 303 indicate the position on which solar battery modules 1 are mounted, and accordingly solar battery modules 1 can more accurately be positioned. Moreover, marks 303 make it possible to readily confirm where the modules should be mounted so that the mounting operation can be completed in a shorter time.

The marks indicating the position where the solar battery modules are mounted may be of any shape such as character, symbol and picture instead of the one (hook-shaped line) shown in FIG. 8.

Fifth Embodiment

Figure 9:
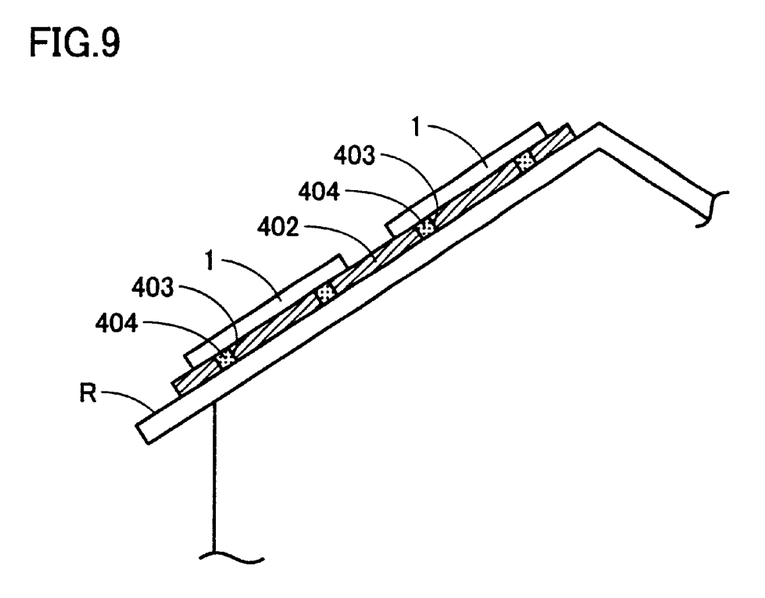
FIG. 9 shows a still further example of the roofing member which has been mounted.

FIG. 9 shows a still further example of the roofing member which has been mounted.

A roofing member 402 shown in FIG. 9 has a characteristic that roofing member 402 has holes 403 formed at positions where solar battery modules 1 are mounted, in addition to the structure of roofing member 2 shown in FIG. 1.

Holes 403 are thus formed at mounting positions and adhesive 404 is applied into holes 403 to directly fix solar battery modules 1 on a roof R. Solar battery modules 1 can accordingly be fastened firmly to roof R.

Holes 403 may have a shape like that of marks 303 shown in FIG. 8 to accurately position solar battery modules 1 by means of holes 403. Moreover, positions of solar battery modules 1 can readily be confirmed by using holes 403 so that the modules can be mounted in a shorter time.

The shape of holes formed in the roofing member is not particularly limited. Holes may be of any arbitrary shape such as circle and quadrangle. In addition, the holes may be provided at any positions where solar battery modules 1 are mounted.

The structure and method for mounting solar battery modules according to the present invention are applicable not only to mounting of the solar battery modules on a roof of a building but also to mounting of the modules on any appropriate supporting base. For example, the structure and method are effective for attachment of solar battery modules onto a roof or wall of a ferroconcrete building.

As heretofore described, according to the structure and method for mounting solar battery modules, the underlying member is fixed at a location where the solar battery modules are to be mounted. The underlying member (roofing member) includes the wiring made of conductive material formed for drawing electric power from a plurality of solar battery modules, and includes connection terminals at respective positions to be connected with each solar battery module. Connection terminals of each solar battery module and the connection terminals of the roofing member are connected to each other. In this way, the operation for mounting the solar battery modules and wiring the modules is facilitated and the time required for the operation can be shortened. In addition, the solar battery modules can be mounted on a roof with almost no level difference between the modules and the roof.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A mounting structure for mounting a plurality of solar battery modules, comprising:

a sheet-shaped roofing member which constitutes at least part of a roof of a structure and which is fixed over a surface at a location where said solar battery modules are to be mounted, said roofing member including therein a wiring made of conductive material formed for drawing electric power from said plurality of solar battery modules and including connection terminals at respective positions to be connected with each solar battery module, and wherein each solar battery module is connected to respective connection terminals of said roofing member, and wherein the plurality of the solar battery modules are electrically connected in series via the wiring of the roofing member so that the wiring of the roofing member carries power from the plurality of solar battery modules.

2. The mounting structure according to claim 1, wherein a plurality of roofing members are used for mounting said solar battery modules.

3. The mounting structure according to claim 1, wherein said roofing member has marks attached for indicating a position where said solar battery modules are to be mounted.

4. The mounting structure according to claim 1, wherein said roofing member has holes formed at respective positions where said solar battery modules are to be mounted.

5. The mounting structure of claim 1, wherein the solar battery modules are separate and distinct components from said roofing member so that the solar battery modules function regardless of whether they are connected to said roofing member.

6. The structure of claim 1, wherein said roofing member comprises an insulating member in which the wiring is at least partially embedded, and wherein the insulating member is provided over at least a reinforcing layer.

7. A mounting method for mounting a plurality of solar battery modules to a roofing member, the method comprising:

providing a sheet-shaped roofing member which is at least part of a roof of a structure;

fixing the roofing member over a surface at a location where said solar battery modules are to be mounted, said roofing member including a conductive wiring for drawing electric power from said plurality of solar battery modules and including connection terminals at respective positions to be connected with solar battery modules, wherein the solar battery modules are separate and distinct components from said roofing member so that the solar battery modules function regardless of whether they are connected to said roofing member, connecting the solar battery modules to respective connection terminals of said roofing member, and thereafter fastening each solar battery module, and wherein the plurality of the solar battery modules are electrically connected in series via the wiring of the roofing member so that the wiring of the roofing member carries power from the plurality of solar battery modules.

8. The mounting method according to claim 7, wherein a plurality of roofing members are used to mount said solar battery modules.

9. The mounting method according to claim 7, wherein said roofing member has marks attached for indicating a position where said solar battery modules are to be mounted.

10. The mounting method according to claim 7, wherein said roofing member has holes formed at respective positions where said solar battery modules are to be mounted.

11. The mounting method according to claim 10, wherein adhesive is applied into said holes formed in said roofing member to bond said solar battery modules.

12. The method of claim 7, wherein said roofing member comprises an insulating member in which the wiring is at least partially embedded, and wherein the insulating member is provided over at least a reinforcing layer.

* * * * *